United States Patent
Tanaka (10) Patent No.: US 6,772,404 B2
(45) Date of Patent: Aug. 3, 2004

(54) PARASITIC ELEMENT EXTRACTION APPARATUS

(75) Inventor: Genichi Tanaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/431,535

(22) Filed: May 8, 2003

(65) Prior Publication Data

US 2004/0103384 A1 May 27, 2004

(30) Foreign Application Priority Data

Nov. 27, 2002 (JP) .................................... 2002-344007

(51) Int. Cl.[7] .............................................. G06F 9/45
(52) U.S. Cl. ............................. 716/10; 716/1; 716/2; 716/4; 716/5; 716/6
(58) Field of Search ........................... 716/2–6, 10–13, 716/15, 16, 18, 19; 703/14, 15, 16

(56) References Cited

U.S. PATENT DOCUMENTS

| | | | | |
|---|---|---|---|---|
| 4,942,536 A | * | 7/1990 | Watanabe et al. | 716/3 |
| 5,629,860 A | * | 5/1997 | Jones et al. | 716/6 |
| 5,818,727 A | * | 10/1998 | Sekiguchi | 716/18 |
| 5,825,661 A | * | 10/1998 | Drumm | 716/10 |
| 6,317,865 B1 | * | 11/2001 | Itoh | 716/11 |
| 6,442,740 B1 | * | 8/2002 | Kanamoto et al. | 716/6 |
| 6,473,881 B1 | * | 10/2002 | Lehner et al. | 716/2 |
| 6,480,998 B1 | * | 11/2002 | Mukherjee et al. | 716/13 |
| 6,487,703 B1 | * | 11/2002 | McBride et al. | 716/4 |
| 6,581,195 B2 | * | 6/2003 | Tanaka | 716/5 |
| 2002/0104064 A1 | * | 8/2002 | Sasaki et al. | 716/6 |
| 2004/0010767 A1 | * | 1/2004 | Agrawal et al. | 716/16 |

FOREIGN PATENT DOCUMENTS

| | | |
|---|---|---|
| JP | 2002-41595 | 2/2002 |
| JP | 2002-215709 | 8/2002 |

* cited by examiner

Primary Examiner—Vuthe Siek
Assistant Examiner—Helen Rossoshek
(74) Attorney, Agent, or Firm—Burns, Doane, Swecker & Mathis, L.L.P.

(57) ABSTRACT

A category classification unit determines a net of interest from nets that show information on the connection between cells defined in logical netlist information, searches the net of interest and the nets adjacent the net of interest in layout information, and classifies the net of interest and the adjacent nets into categories set while attention is paid to how potentials of the adjacent nets operate relatively to the potential of the net of interest defined in a constraint, based on the logical netlist information and logical information in a library. A parasitic element extraction unit extracts parasitic elements of extraction elements defined in the constraint for each of the categories into which the nets are classified by the category classification unit, and outputs connection information including the parasitic elements.

5 Claims, 5 Drawing Sheets

PARASITIC ELEMENT EXTRACTION APPARATUS

BACKGROUND OF THE INVENTION

1) Field of the Invention

The present invention relates to a parasitic element extraction apparatus that extracts the parasitic element of a semiconductor integrated circuit.

2) Description of the Related Art

In recent years, following the development of the multi-layer wiring and microfabrication in the manufacturing of semiconductors, there is a trend for making a gate mounted on one chip of a semiconductor integrated circuit large in scale to thereby acquire a semiconductor integrated circuit with one chip that has a high performance and is capable of performing advanced functions. Therefore, a logical design based on manual circuit diagram drawing is indispensable, and a circuit design according to a top-down design scheme using a hardware description language such as VHDL (Very high speed integrated circuit Hardware Description Language) or Verilog-HDL (Verilog Hardware Description Language) and a logical synthesis apparatus becomes common.

However, when the size of the semiconductor to be manufactured is 0.35 $\mu$m or small, then a delay time caused by wirings increases more than the delay time of the transistors. As a result, with the design scheme of developing a design to a logical circuit by the logical synthesis apparatus based on the hardware description language described at functional level, creating a net list, and laying out the logical circuit by an automatic placement and routing apparatus, it is impossible to obtain a semiconductor integrated circuit that actually functions. In other words, a semiconductor integrated circuit that actually functions cannot be obtained when the semiconductor integrated circuit that has a minimum processing size in the manufacturing of semiconductors reduced to deep submicron is not designed in light of problems related to manufacturing techniques such as power supply distribution, signal integrity, and electro migration. Therefore, it is necessary to extract parasitic elements from a net list after the layout and to perform a circuit simulation.

Nevertheless, because of the large scale of the semiconductor integrated circuit, when parasitic elements are extracted from all the related nets to a net of interest independently of one another, the quantity of information becomes so large that it disadvantageously takes considerably long time to calculate delay after the extraction of the parasitic elements. In addition, when parasitic elements are extracted on the assumption that all the nets are equal in potential; accuracy in the delay calculation is disadvantageously deteriorated because of the difference between simulated operation and actual operation.

To solve this problem, according to the conventional art, for example, Japanese Patent Application Laid-Open No. 2002-41595 (hereinafter "Patent Document 1"), an active node the potential of which changes and an inactive node the potential of which does not change are extracted in executing a pre-layout simulation, thereby facilitating selecting a parasitic element extraction target node in layout pattern data.

However, a transistor has different delays between the rise and fall of a signal. Therefore, according to the conventional art of extracting the parasitic elements based only on whether a potential changes, accuracy in the delay calculation and signal integrity is disadvantageously deteriorated since the operation of the semiconductor integrated circuit in the simulation differs from the actual operation of the semiconductor integrated circuit.

SUMMARY OF THE INVENTION

It is an object of the present invention to solve at least the problems in the conventional technology.

The parasitic element extraction apparatus extracts parasitic elements based on logical netlist information that defines cell information for defining cells of a semiconductor integrated circuit and nets showing connection between the cells, layout information that defines position information on wiring patterns of the cells and the nets connecting the cells, the position information being used when placement and routing are carried out using the logical netlist information, and a library that defines capacitances and inductances for the wiring patterns.

The parasitic element extraction apparatus according to the present invention comprises a category classification unit that classifies the nets defined in the logical netlist information based on a constraint that defines at least two categories of a first category to a third category among five categories; and a parasitic element extraction unit that extracts the parasitic elements while attention is paid to any one of the capacitances and the inductances defined in the constraint for each of the classified nets, and generates connection information including the extracted parasitic elements.

The five categories are a first category related to the nets adjacent a net of interest among the nets defined in the logical netlist information and having potentials of the adjacent nets being likely to change in a same direction as a direction of the potential of the net of interest; a second category related to the nets adjacent the net of interest and having the potentials likely to change in an opposite direction to the direction of the potential of the net of interest; a third category related to the nets adjacent the net of interest and having the potentials likely to change in both the same direction and the opposite direction to the direction of the potential of the net of interest; a fourth category related to the nets having the potentials fixed even when logical of the semiconductor integrated circuit changes; and a fifth category related to the nets adjacent the net of interest that do not affect any one of the capacitance and the inductance for the net of interest or that can ignore any one of the capacitance and the inductance for the net of interest.

The other objects, features and advantages of the present invention are specifically set forth in or will become apparent from the following detailed descriptions of the invention when read in conjunction with the accompanying drawings.

DETAILED DESCRIPTION

Exemplary embodiments of the parasitic element extraction apparatus according to the present invention are explained hereinafter in detail with reference to the accompanying drawings.

Figure 1:
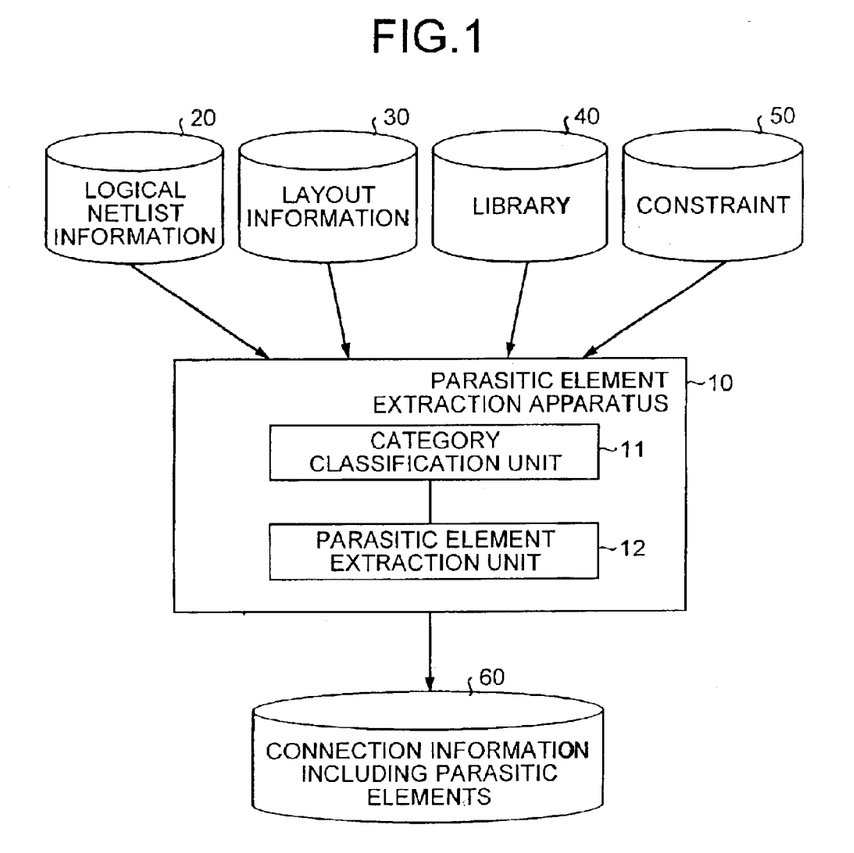
FIG. 1 shows the configuration of a parasitic element extraction apparatus and input/output relations thereof in a first embodiment according to the present invention.

A parasitic element extraction apparatus according to a first embodiment of the present invention is explained with reference to FIG. 1 to FIG. 6. FIG. 1 shows the configuration of a parasitic element extraction apparatus and input/output relations thereof in a first embodiment according to the present invention.

Logical netlist information 20 defines cell information that designates cells by which a semiconductor integrated circuit realizes a desired function and connection information (net list) indicating the connection between the cells.

Layout information 30 defines pattern information for executing the layout of the logical netlist information 20 using an automatic placement and routing apparatus. Namely, the layout information 30 defines position information as to the positions, in a chip of the semiconductor integrated circuit, of the wiring patterns of the cells and the nets connecting the cells defined in the logical netlist information 20. In addition, the layout information 30 defines the wiring lengths of the nets defined in the logical netlist information 20.

A library 40 defines logical information on the cells defined in the logical netlist information 20 and capacitances and inductances for the wiring patterns defined in the layout information 30.

A constraint 50 defines extraction elements such as categories for classifying the nets in the logical netlist information 20, capacitances and inductances, to which attention is paid when extracting parasitic elements.

Figure 2:
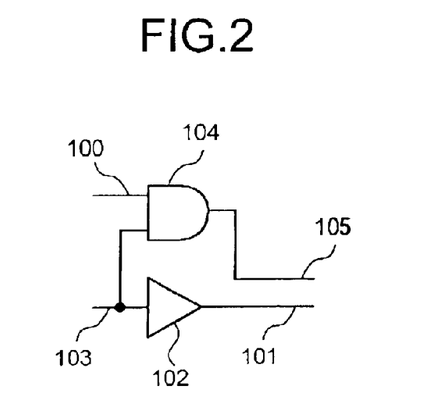
FIG. 2 explains the first category.

FIGS. 2 to 5 explain five categories for the parasitic element extraction apparatus according to the present invention. The first category is related to nets likely to operate in the same direction and it is shown in FIG. 2. A logical circuit shown in FIG. 2 consists of a buffer (hereafter "BUF") 102 and an AND gate (hereinafter "AND") 104. It is assumed herein that a net 101 driven by the BUF 102 is the net of interest. The net 101 is changed by a signal transmitted from a net 103. When a net 100 connected to one of the input terminals of the AND 104 is at a high logical level (hereinafter ""H"") and the net 103 changes from a low logical level (hereinafter ""L"") to "H", the net 101 changes from "L" to "H" via the BUF 102. Since the net 103 is connected to the other input terminal of the AND 104, a net 105 changes from "L" to "H" via the AND 104. If the net 103 changes from "H" to "L", the net 101 changes from "H" to "L" via the BUF 102 and the net 105 changes from "H" to "L" via the AND 104. That is, when the net is at "H", the potential of the net 105 changes in the same direction as that of the net 101 that is the net of interest.

When the net 100 is at "L", the net 105 remains "L" even when the net 103 changes. Thus, a net (net 105 in FIG. 2) the potential of which is likely to change to the same potential as that of the net of interest (net 101 in FIG. 2) when the potential of the net 101 changes, is referred to as "a net likely to operate in the same direction".

Figure 3:
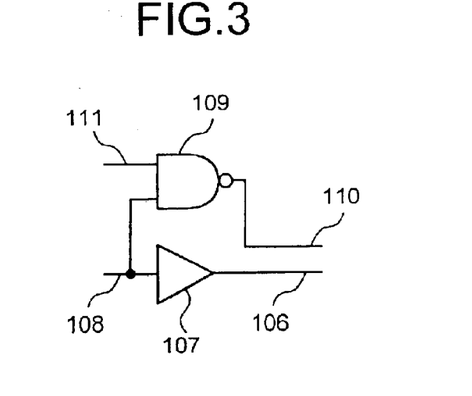
FIG. 3 explains the second category.

The second category is related to nets likely to operate in the opposite direction and it is shown in FIG. 3. A logical circuit shown in FIG. 3 consists of a BUF 107 that is a buffer, and a NAND 109 that is a NAND gate. It is assumed herein that a net 106 driven by the BUF 107 is a net of interest. A net 106 is changed by a signal transmitted from a net 108. If a net 111 connected to one of the input terminals of the NAND 109 is at "H" and the net 108 changes from "L" to "H", the net 106 changes from "L" to "H" via the BUF 107. Since the net 108 is connected to the other input terminal of the NAND 109, a net 110 changes from "H" to "L" via the NAND 109. When the net 108 changes from "H" to "L", the net 106 changes from "H" to "L" via the BUF 107 and the net 110 changes from "L" to "H" via the NAND 109. That is, when the net 111 is at "H", the potential of the net 110 changes in the opposite direction to that of the potential of the net 106 that is the net of interest.

When the net 111 is at "L", the net 110 remains "H" even when the net 108 changes. Thus, a net (net 110 in FIG. 3), the potential of which is likely to change in the opposite direction to that of the net of interest 106 when the potential of the net 106 changes, is referred to as "a net likely to operate in the opposite direction".

Figure 4:
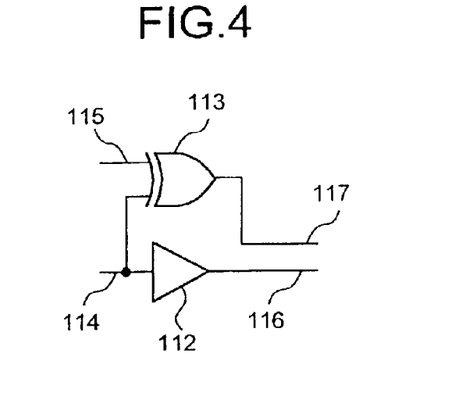
FIG. 4 explains the third category.

The third category is related to nets likely to operate in the both directions and it is shown in FIG. 4. A logical circuit shown in FIG. 4 consists of a BUF 112 that is a buffer, and an EXOR 113 that is an EXCLUSIVE-OR gate. It is assumed herein that a net 116 driven by the BUF 112 is a net of interest. The net 116 is changed by a signal transmitted from a net 114. When a net 115 connected to one of the input terminals of the EXOR 113 is at "L" and the net 114 changes from "L" to "H", the net 116 changes from "L" to "H" via the BUF 112. Since the net 114 is connected to the other input terminal of the EXOR 113, a net 117 changes from "L" to "H" via the EXOR 113. When the net 114 changes from "H" to "L", the net 116 changes from "H" to "L" and the net 117 changes from "H" to "L".

When the net 115 connected to the one input terminal of the EXOR 113 is at "H" and the net 114 changes from "L" to "H", the net 116 changes from "L" to "H" via the BUF 112. Since the net 114 is connected to the other input terminal of the EXOR 113, the net 117 changes from "H" to "L" via the EXOR 113. When the net 114 changes from "H" to "L", the net 116 changes from "H" to "L" and the net 117 changes from "L" to "H".

Thus, a net (net 117 in FIG. 4), the potential of which is likely to change in the same direction as or opposite direction to that of the potential of the net 116 when the potential 116 that is the net of interest changes, is referred to as "a net likely to operate in the both directions".

Figure 5:
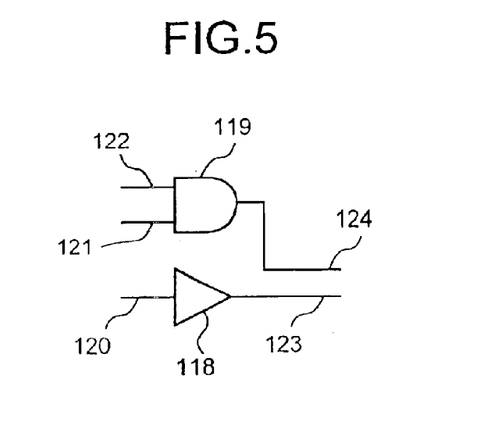
FIG. 5 also explains the third category.

Further, a logical circuit shown in FIG. 5 consists of a BUF 118 that is a buffer, and an AND 119 that is an AND gate. It is assumed herein that a net 123 driven by the BUF 118 is a net of interest. The potential of a net 123 is changed by a signal transmitted from a net 120. The potential of a net 124 changes from "L" to "H" or "H" to "L" via the AND 119 by signals transmitted from a net 121 and a net 122. That is, the potential change of the net 124 is not affected by the signal transmitted from the net 120. Thus, a net (net 124 in FIG. 5), the potential of which changes independent of the change of the potential of the net 123 that is the net of interest, is be also referred to as "a net likely to operate in the both directions".

The fourth category is related to inoperative nets. The inoperative nets include a power supply net, a ground net and the like. Namely, a net the potential of which is fixed and unchanged is referred to as "an inoperative net".

The fifth category is related to ignorable nets. Specifically, the ignorable net means a net for which the capacitance or inductance between a net of interest and the net is so low that the net does not affect the delay calculation and signal integrity. It is noted that nets may be designated in, for example, the constraint 50 and may be classified into the fifth category as ignorable nets.

Referring back to FIG. 1, at least two categories that include one of the first to third categories out of the first to fifth categories are defined by the constraint 50. For example, the constraint 50 defines 'the first category and the second category', 'the first category and the third category', 'the first and second categories and the fourth and fifth categories', 'the first, second and third categories and the fourth and fifth categories' or the like. In addition, as for the extraction elements to which attention is paid when extracting parasitic elements, the constraint 50 defines, for example, 'capacitance', 'inductance', 'both capacitance and inductance' or the like.

The parasitic element extraction apparatus 10 includes a category classification unit 11 and a parasitic element extraction unit 12. Based on the logical netlist information 20, the layout information 30, the library 40, and the constraint 50, the parasitic element extraction apparatus 10 extracts parasitic elements, and outputs the connection information 60 that includes the parasitic elements.

The category classification unit 11 determines a net of interest from the nets defined in the logical netlist information 20 and that connect the cells, searches nets adjacent the net of interest in the layout information 30, and classifies the nets into the categories defined in the constraint 50 based on the logical information defined in the library 40.

The parasitic element extraction unit 12 extracts the parasitic elements defined in the constraint 50 for each category, and generates connection information 60 that includes the parasitic elements.

Figure 6:
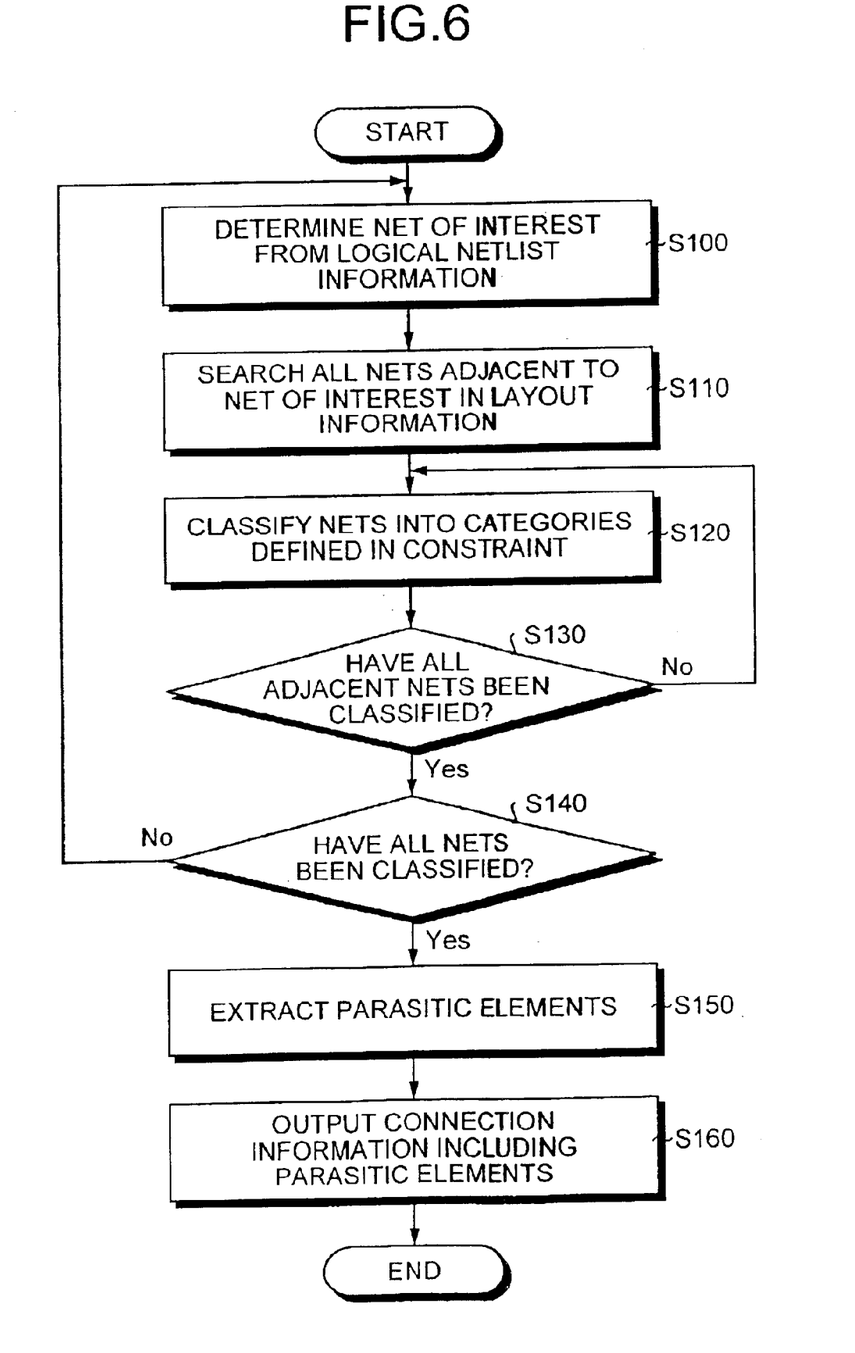
FIG. 6 is a flow chart that explains the operation of the parasitic element extraction apparatus in the first embodiment.

The operation of the parasitic element extraction apparatus 10 in the first embodiment is explained with reference to the flow chart shown in FIG. 6. The category classification unit 11 determines a net of interest from the nets defined in the logical netlist information 20 and that connect the cells (at a step S100). The category classification unit 11 searches all the nets adjacent the net of interest from the position information defined in the layout information 30 (at a step S110).

The category classification unit 11 classifies all the nets adjacent the net of interest into the categories defined in the constraint 50 for one net (at a step S120). Specifically, the category classification unit 11 searches nets corresponding to the nets adjacent the net of interest and searched from the layout information 30, in the logical netlist information 20, and extracts the cells that drive the searched cells and the cell that drives the cell of interest. The category classification unit 11 then classifies these nets into the categories defined in the constraint 50 based on the net connected to the input terminal of the cell that drives the net of interest, the nets connected to the input terminals of the cells that drive the searched cells, and the logical information defined in the library 40 by tracing logical until the classifications of the nets are determined as the category for the nets that operate in the same direction as the direction of the net of interest, the category for the nets that operate in the opposite direction, the category for the nets that operates in both directions, the category for the nets that do not operate, and the category for the ignorable nets. The category classification unit 11 repeats these operations, thus classifying the net of interest and all the nets adjacent the net of interest into the categories defined in the constraint 50 (at a step S120 and a step S130).

When finishing the classification of the net of interest and all the nets adjacent the net of interest into the categories defined in the constraint 50, the category classification unit 11 determines a new net of interest, and classifies all the nets in the logical netlist information 20 into the categories defined in the constraint 50 (at the step S100 to a step S140).

When the category classification is finished, the parasitic element extraction unit 12 extracts parasitic elements for the extraction elements defined in the constraint 50 (at a step S150). An example in which the capacitance is defined as the extraction element in the constraint and parasitic elements for the nets classified into the first category is explained. A capacitance common to the nets in the first category is calculated. That is, a capacitance with which adjacent wirings are likely to operate in the same direction is calculated based on the capacitances defined in the library 40. The capacitances of the respective nets are calculated from the wiring lengths and wiring widths of the nets classified in the library 40. The capacitance of the entire nets in the first category is calculated from the calculated respective capacitances and the calculated capacitance common to the first category nets. The parasitic element extraction unit 12 outputs connection information that includes the parasitic elements thus extracted (at a step S160).

As can be seen, in the first embodiment, the category classification unit 11 determines the net of interest from the nets defined in the logical netlist information 20 and that connect the cells, and searches the nets adjacent the net of interest in the layout information 30. Further, the category classification unit 11 classifies the adjacent nets into the categories set while considering how the potentials of the nets adjacent the net of interest defined in the constraint 50 operate relatively to the net of interest, based on the logical netlist information 20 and the logical information in the library 40. The parasitic element extraction unit 12 extracts the parasitic elements of the extraction elements defined in the constraint 50 for each of the categories into that the nets are classified by the category classification unit 11. That is, the parasitic element extraction unit 12 classifies the nets into the categories set while considering how the potentials of the nets adjacent the net of interest operate relatively to the net of interest. Therefore, it is possible to keep accuracy in the delay calculation and the calculation of signal integrity, and to shorten parasitic element extraction time.

When parasitic elements of both the capacitance and the inductance are defined as extraction elements to be extracted in the constraint 50, the category classification may be defined while a capacitance, and an inductance are assumed as one parasitic element, or the category classification for capacitance and that for inductance may be separately defined. To be specific, capacitances may be classified into the first category and the second category while inductances may be classified into the first and second categories and the fourth and fifth categories. That is, different category classifications may be defined for the capacitance and the inductance. Needless to say, the same category classifications may be defined for the capacitance and the inductance. Thus, it is possible to discriminate the category classification for the capacitance from that for the inductance, to keep high calculation accuracy in the delay calculation and the calculation of signal integrity, and to shorten parasitic element extraction time.

Further, in the parasitic element extraction apparatus according to the first embodiment, the category classification unit 11 searches the adjacent nets based on the layout information 30. Alternatively, the category classification unit 11 may classify the nets into the categories based on the logical netlist information 20 and the logical information in the library 40, and the parasitic element extraction unit 12 may search the adjacent nets based on the layout information 30 and extract parasitic elements.

A parasitic element extraction apparatus according to a second embodiment of the present invention is explained with reference to FIGS. 7 and 8. In the first embodiment, the parasitic elements are extracted by classifying all the nets defined in the logical netlist information 20 into the categories defined in the constraint 50. On the other hand, in the second embodiment, the nets defined in the logical netlist information 20 are designated in the constraint 50, thereby classifying specific nets into categories and extracting parasitic elements. Further, the delay calculation and the timing verification are carried out for the nets including extracted parasitic elements, and the results are reflected in the category classification.

Figure 7:
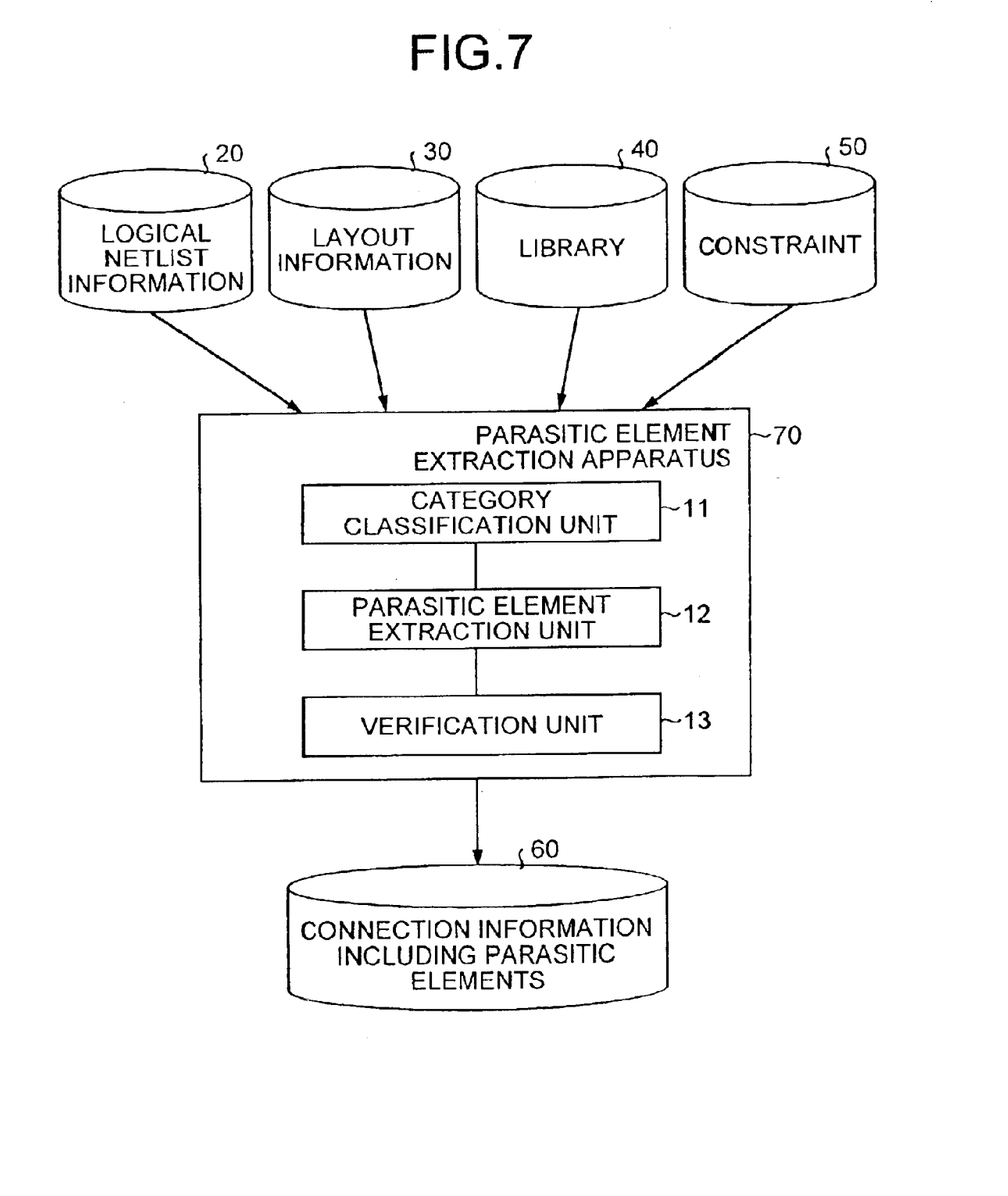
FIG. 7 shows the configuration of a parasitic element extraction apparatus and input/output relation thereof in a second embodiment according to the present invention.

FIG. 7 shows the configuration of a parasitic element extraction apparatus 70 and input/output relations thereof in the second embodiment according to the present invention. The parasitic element extraction apparatus 70 in the second embodiment includes a verification unit 13 in addition to the constituent elements shown in FIG. 1. The same constituent elements as those in FIG. 1 that shows the configuration of the parasitic element extraction apparatus 10 and input/output relations thereof in the first embodiment according to the present invention, are denoted by the same reference symbols and is not repeatedly explained herein.

The verification unit 13 calculates delays and verifies timing based on the connection information including parasitic elements.

The library 40 defines not only the logical information on the cells defined in the logical netlist information 20 and the capacitances and inductances for the wiring patterns defined in the layout information 30 as explained in the first embodiment, but also cell delay time and timing information (timing constraints such as setup time, hold time and recovery time) characteristic of each cell.

The constraint 50 defines not only extraction elements such as categories for classifying the nets in the logical netlist information 20, capacitances and inductances, to which attention is paid when extracting parasitic elements as explained in the first embodiment, but also nets for extracting parasitic elements. As the nets for extracting parasitic elements, the nets for which a user judges that it is necessary to extract such parasitic elements as critical paths and to verify the nets are designated.

Figure 8:
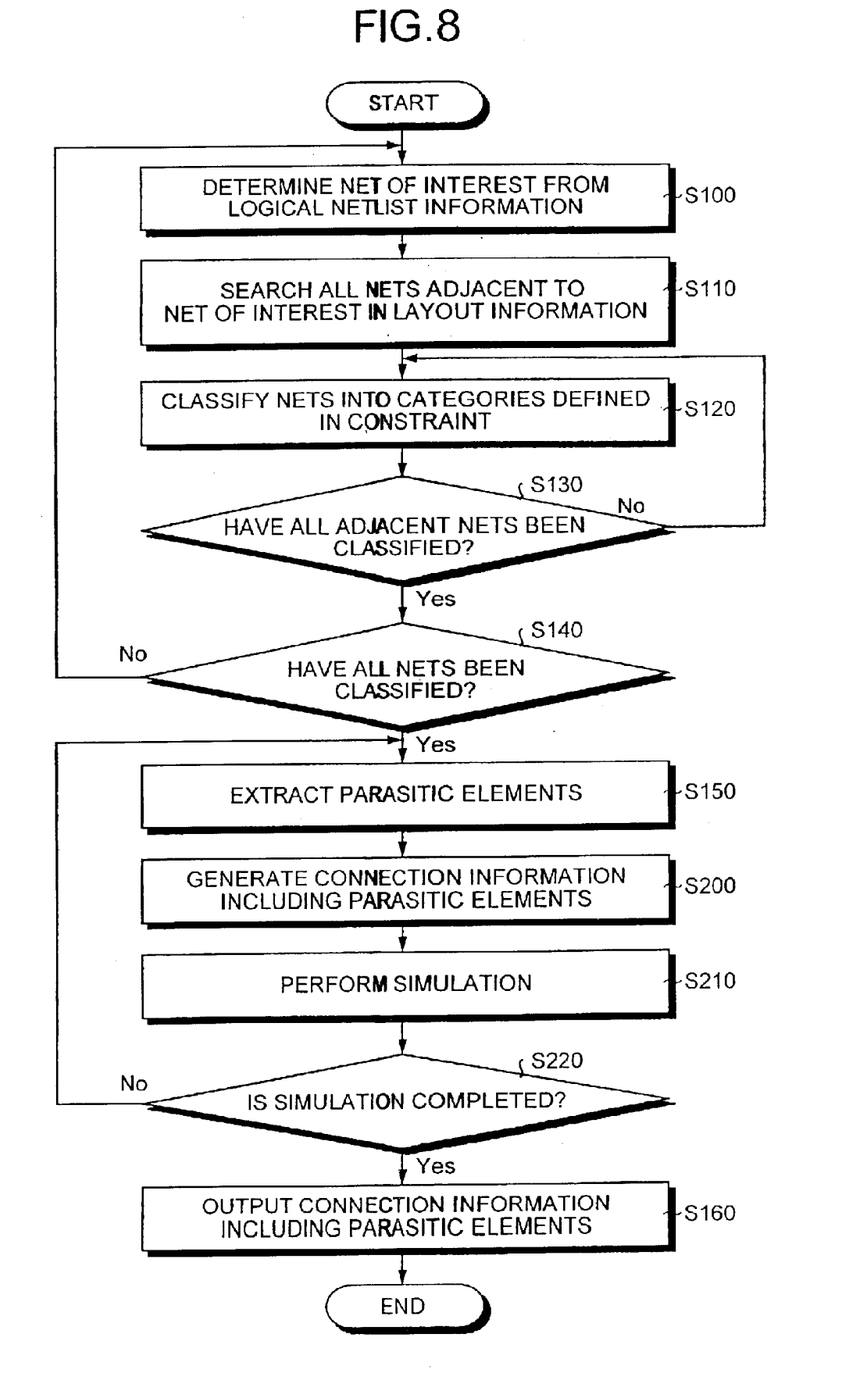
FIG. 8 is a flow chart that explains the operation of the parasitic element extraction apparatus in the second embodiment.

Referring to the flow chart show in FIG. 8, the operation of the parasitic element extraction apparatus 70 in the second embodiment is explained. The step S100 to the step S150 at which the category classification unit 11 classifies nets of interest and nets adjacent the nets of interest into the categories defined in the constraint 50, and the parasitic element extraction unit 12 extracts parasitic elements for the extraction elements defined in the constraint 50, are the same in operation as those in the first embodiment. Therefore, these steps are not explained in detail.

The category classification unit 11 determines the nets defined in the constraint 50 as nets of interest. The category classification unit 11 repeats operations for classifying each net of interest and all the nets adjacent the net of interest into the categories defined in the constraint 50, for all the nets defined in the constraints (at the step S100 to the step S140).

The parasitic element extraction unit 12 extracts parasitic elements for the extraction elements defined in the constraint 50 (at the step S150). The parasitic element extraction unit 12 then generates connection information including the parasitic elements (at a step S200).

The verification unit 13 carries out a simulation based on the connection information that includes the parasitic elements and that are generated by the parasitic element extraction unit 12, and capacitances and inductances for the wiring patterns defined in the library 40 as well as the cell delay time characteristic of each cell (at a step S210). Specifically, when the capacitance is defined as an extraction element, for example, the capacitances for the wiring patterns are added to the connection information that includes the parasitic elements and that are generated by the parasitic element extraction unit 12, and the delay time of the nets in the signal propagation is calculated based on the cell delay time. Using the calculated delay time, it is determined whether the nets of interests and the nets adjacent the nets of interests are correctly classified into the categories. When the category classification for the nets of interests differs from that for the adjacent cells, the category classification for the nets adjacent the nets of interest is changed and the parasitic elements are extracted. Specifically, a static simulation is carried out while considering delay time, and the nets are classified into the categories based on the potential changes of the nets of interest and the adjacent nets. In addition, a timing simulation is carried out based on the timing constraints, and the simulation result is reflected in the category classification. The verification unit 13 repeatedly carries out these simulations and the category classification in which the simulation results are reflected (at the step S150, the steps S200 to S220), and outputs connection information 60 including final parasitic elements (at a step S160).

As can be seen, in this second embodiment, the nets defined in the logical netlist information 20 are defined in the constraint 50, and parasitic elements are extracted only for the designated nets in the semiconductor integrated circuit. In other words, the category classification information 11 classifies the nets designated in the constraint 50 into the categories. The parasitic element extraction unit 12 extracts parasitic elements based on the extraction elements defined in the constraint 50 for the nets classified into the categories defined in the constraint 50, and generates the connection information including the parasitic elements. The verification unit 13 calculates the cell delay time characteristic of each cell and delay time of the wirings including the parasitic elements for the connection information including the parasitic elements, carries out the static simulation, classifies the nets of interests and the adjacent nets into the categories while considering the simulation result, and extracts the parasitic elements. By doing so, it is possible to extract each net of interest and the nets adjacent the net of interest into the categories set while considering how the potentials of the adjacent nets operate relatively to the net of interest, to keep high accuracy in the delay calculation and the calculation of signal integrity, and to shorten parasitic time extraction time.

In the second embodiment, the nets are designated in the constraint 50 so that specific nets are classified into the categories. Alternatively, the parasitic (delay) elements may be extracted by first extracting all the nets defined in the logical netlist information 20, extracting the nets having long delay time by the verification unit, and classifying only the extracted nets into the categories while considering the delay time.

In the first and second embodiments, the nets are classified into the five categories. However, the nets that are likely to operate in the same direction and that belong to the first category, the nets that are likely to operate in the opposite direction and that belong to the second category, and the nets that are likely to operate in the both directions and that belong to the third category, can be classified in more detail, based on the adjacent nets and the relative quantities of the potential changes of the adjacent nets. For example, when a semiconductor integrated circuit includes two power supplies, the first category related to the nets the potential of which are likely to change in the same direction by the power supply voltages can be further classified into two sub-categories. It is thereby possible to apply the parasitic element extraction apparatus according to the present invention to an analog circuit, a digital circuit that includes a plurality of potentials, and the like.

As explained so far, in the parasitic element extraction apparatus according to the present invention, the category classification unit classifies the nets defined in the logical netlist information based on a constraint that defines at least two categories including one of a first category to a third category among five categories, the five categories consisting of: the first category related to the nets adjacent a net of interest among the nets defined in the logical netlist information and having potentials of the adjacent nets being likely to change in a same direction as a direction of the potential of the net of interest; a second category related to the nets adjacent the net of interest and having the potentials likely to change in an opposite direction to the direction of the potential of the net of interest; the third category related to the nets adjacent the net of interest and having the potentials likely to change in both the same direction and the opposite direction to the direction of the potential of the net of interest; a fourth category related to the nets having the potentials fixed even when logical of the semiconductor integrated circuit changes; and a fifth category related to the nets adjacent the net of interest that do not affect the capacitance and/or inductance for the net of interest or that can ignore the capacitance and/or inductance for the net of interest, and the parasitic element extraction unit extracts the parasitic elements while attention is paid to the capacitances and/or the inductances defined in the constraint for each of the classified nets, and generates connection information including the extracted parasitic elements. It is, therefore, possible to keep high accuracy in the delay calculation, the calculation of signal integrity or the like, and to shorten parasitic element extraction time.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A parasitic element extraction apparatus that extracts parasitic elements based on logical netlist information that defines cell information for defining cells of a semiconductor integrated circuit and nets showing connection between the cells, layout information that defines position information on wiring patterns of the cells and the nets connecting the cells, the position information being used when placement and routing are carried out using the logical netlist information, and a library that defines capacitances and inductances for the wiring patterns, the parasitic element extraction apparatus comprising:

a category classification unit that classifies the nets defined in the logical netlist information based on a constraint that defines at least two categories of a first category to a third category among five categories, the five categories including the first category related to the nets adjacent a net of interest among the nets defined in the logical netlist information and having potentials of the adjacent nets being likely to change in a same direction as a direction of the potential of the net of interest;

a second category related to the nets adjacent the net of interest and having the potentials likely to change in an opposite direction to the direction of the potential of the net of interest;

the third category related to the nets adjacent the net of interest and having the potentials likely to change in both the same direction and the opposite direction to the direction of the potential of the net of interest;

a fourth category related to the nets having the potentials fixed even when logical of the semiconductor integrated circuit changes; and a fifth category related to the nets adjacent the net of interest that do not affect any one of the capacitance and the inductance for the net of interest or that can ignore any one of the capacitance and the inductance for the net of interest; and a parasitic element extraction unit that extracts the parasitic elements based upon any one of the capacitances and the inductances defined in the constraint for each of the classified nets, and generates connection information including the extracted parasitic elements.

2. The parasitic element extraction apparatus according to claim 1, wherein when the capacitances and the inductances are defined in the constraint, the category classification unit classifies the nets into the at least two categories including one of the first category to the third category among the five categories based upon the capacitances, and classifies the nets into the at least two categories including one of the first category to the third category among the five categories based upon the inductances, former category classification and latter category classification being carried out separately from each other, and the parasitic element extraction unit extracts the parasitic elements for each of the nets classified separately for the capacitances and the inductances based upon the capacitances and the inductances, and generates the connection information including the parasitic elements.

3. The parasitic element extraction apparatus according to claim 1, further comprising a verification unit that verifies delay time of the connection information including the parasitic elements based on the library that defines the delay time of the cells, wherein the net of interest and the adjacent nets are re-classified based on the constraint that defines the at least two categories including one of the first category to the third category among the five categories based upon the delay time.

4. The parasitic element extraction apparatus according to claim 1, wherein the nets for extracting the parasitic elements are designated in the constraint, and only the designated specific nets are classified into the categories.

5. The parasitic element extraction apparatus according to claim 1, wherein the nets in the first category to the third category are further classified into a plurality of sub-categories based on relative quantities of potential changes of the net of interest and the adjacent nets for the potential changes of the first category to the third categories.

* * * * *